(12) United States Patent
Kim et al.

(10) Patent No.: US 11,557,513 B2
(45) Date of Patent: Jan. 17, 2023

(54) SEMICONDUCTOR DEVICE

(71) Applicant: SAMSUNG ELECTRONICS CO., LTD., Suwon-si (KR)

(72) Inventors: Moon Keun Kim, Hwaseong-si (KR); Jae Wha Park, Yongin-si (KR); Jun Kwan Kim, Seoul (KR); Hyo Jeong Moon, Osan-si (KR); Seung Jong Park, Seoul (KR); Seul Gi Bae, Yeosu-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 108 days.

(21) Appl. No.: 17/215,365

(22) Filed: Mar. 29, 2021

(65) Prior Publication Data

US 2021/0242079 A1    Aug. 5, 2021

Related U.S. Application Data

(63) Continuation of application No. 16/271,120, filed on Feb. 8, 2019, now Pat. No. 10,971,395.

(30) Foreign Application Priority Data

Jul. 19, 2018    (KR) .......................... 10-2018-0083916

(51) Int. Cl.
*H01L 21/768*    (2006.01)
*H01L 23/532*    (2006.01)
(Continued)

(52) U.S. Cl.
CPC .. *H01L 21/76832* (2013.01); *H01L 21/02274* (2013.01); *H01L 21/76802* (2013.01);
(Continued)

(58) Field of Classification Search
None
See application file for complete search history.

(56) References Cited

U.S. PATENT DOCUMENTS

| 6,023,093 A | 2/2000 | Gregor et al. |
| 6,208,002 B1 | 3/2001 | Sataka et al. |

(Continued)

FOREIGN PATENT DOCUMENTS

| JP | 2009-094348 A | 4/2009 |
| KR | 10-2005-0060268 A | 6/2005 |
| KR | 10-2007-0106155 A | 11/2007 |

OTHER PUBLICATIONS

Biswas, et al., "Enhanced stability of deuterium in silicon." Applied Physics Letters 72, No. 26, 3500 (Jun. 1998).

(Continued)

*Primary Examiner* — Bradley Smith
(74) *Attorney, Agent, or Firm* — Lee IP Law, P.C.

(57) ABSTRACT

A method for fabricating a semiconductor device includes forming a first wiring layer, the first wiring layer including a first metal wiring and a first interlayer insulating film wrapping the first metal wiring on a substrate, forming a first via layer, the first via layer including a first via that is in electrical connection with the first metal wiring, and a second interlayer insulating film wrapping the first via on the first wiring layer, and forming a second wiring layer, the second wiring layer including a second metal wiring that is in electrical connection with the first via, and a third interlayer insulating film wrapping the second metal wiring on the first via layer, wherein the third interlayer insulating film contains deuterium and is formed through chemical vapor deposition using a first gas containing deuterium and a second gas containing hydrogen.

20 Claims, 12 Drawing Sheets

(51) Int. Cl.
*H01L 21/02* (2006.01)
*H01L 23/522* (2006.01)

(52) U.S. Cl.
CPC .. *H01L 21/76831* (2013.01); *H01L 21/76877* (2013.01); *H01L 23/5226* (2013.01); *H01L 23/53295* (2013.01)

(56) References Cited

U.S. PATENT DOCUMENTS

| | | | |
|---|---|---|---|
| 6,943,126 B1* | 9/2005 | Narayanan | H01L 21/28176 438/791 |
| 6,975,019 B2 | 12/2005 | Hazama | |
| 7,087,507 B2 | 8/2006 | Koldiaev et al. | |
| 8,168,482 B2 | 5/2012 | Miyata | |
| 2002/0168855 A1 | 11/2002 | Smythe et al. | |
| 2009/0020831 A1* | 1/2009 | Ramkumar | H01L 29/40117 257/E29.345 |
| 2012/0199942 A1 | 8/2012 | Kageyama et al. | |
| 2012/0217497 A1 | 8/2012 | Shoji et al. | |
| 2019/0348535 A1 | 11/2019 | Lilak et al. | |

OTHER PUBLICATIONS

Chang, et al., "Impact of high-pressure deuterium oxide annealing on the blocking efficiency and interface quality of metal-alumina-nitride-oxide-silicon-type flash memory devices." Applied Physics Letters 91, 192111(1-3) (2007).

Lee, "Improving Performance and Reliability of MOS Devices Using Deuterium Implantation," Cutting Edge Nanotechnology, Edited by Dragica Vasileska, IntechOpen, DOI: 10.5772/8856. pp 15-32, (Mar. 1, 2010). Available from: https: //www.intechopen.com/books/cutting-edge-nanotechnology/improving-performance-and-reliability-of-mos-devices-using-deuterium-implantation.

* cited by examiner

SEMICONDUCTOR DEVICE

CROSS REFERENCE TO RELATED APPLICATIONS

This is a continuation application based on pending U.S. patent application Ser. No. 16/271,120, filed on Feb. 8, 2019, the entire contents of which is hereby incorporated by reference.

Korean Patent Application No. 10-2018-0083916, filed on Jul. 19, 2018, in the Korean Intellectual Property Office, and entitled: "Method for Fabricating Semiconductor Device," is incorporated by reference herein in its entirety.

BACKGROUND

1. Field

Embodiments relates to a method for fabricating a semiconductor device.

2. Description of the Related Art

As down-scaling of a semiconductor device is accelerated with the development of the electronic technology, high-integration and low-power of a semiconductor chip are demanded.

SUMMARY

Embodiments are directed to a method for fabricating a semiconductor device, the method including forming a first wiring layer, the first wiring layer including a first metal wiring and a first interlayer insulating film wrapping the first metal wiring on a substrate, forming a first via layer, the first via layer including a first via that is in electrical connection with the first metal wiring, and a second interlayer insulating film wrapping the first via on the first wiring layer, and forming a second wiring layer, the second wiring layer including a second metal wiring that is in electrical connection with the first via, and a third interlayer insulating film wrapping the second metal wiring on the first via layer, wherein the third interlayer insulating film contains deuterium and is formed through chemical vapor deposition using a first gas containing deuterium and a second gas containing hydrogen.

Embodiments are also directed to a method for fabricating a semiconductor device, the method including forming a first wiring layer, the first wiring layer including a first metal wiring and a first interlayer insulating film wrapping the first metal wiring on a substrate, and forming a second wiring layer, the second wiring layer including a first via that is in electrical connection with the first metal wiring on the first wiring layer, a second metal wiring that is on the first via and in electrical connection with the first via, and a second interlayer insulating film wrapping the first via and the second metal wiring, wherein the second interlayer insulating film contains deuterium and is formed through chemical vapor deposition using a first gas containing deuterium.

Embodiments are also directed to a method for fabricating a semiconductor device, the method including forming a first interlayer insulating film including a first trench on a substrate, forming a first metal wiring filling the first trench, forming a first etch stop film covering the first interlayer insulating film and the first metal wiring, forming a second interlayer insulating film including a second trench penetrating through the first etch stop film on the first etch stop film, forming a first via filling the second trench, forming a second metal wiring on the first via, and forming a third interlayer insulating film so as to cover a side surface and an upper surface of the second metal wiring on the second interlayer insulating film, wherein the third interlayer insulating film includes deuterium and is formed through chemical vapor deposition using a first gas containing deuterium and a second gas containing hydrogen.

BRIEF DESCRIPTION OF THE DRAWINGS

Features will become apparent to those of skill in the art by describing in detail example embodiments with reference to the attached drawings in which.

DETAILED DESCRIPTION

Hereinafter, with reference to FIG. 1, a semiconductor device fabricated by a fabrication method of a semiconductor device according to an example embodiment will be described.

Figure 1:
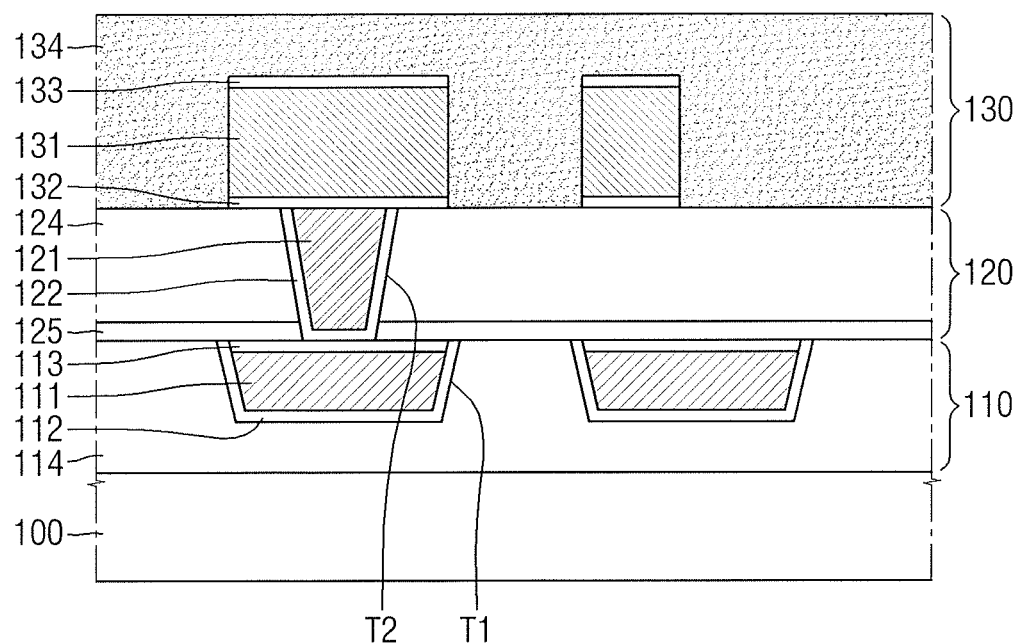
FIG. 1 illustrates a view provided to explain a semiconductor device fabricated by a fabrication method of a semiconductor device according to an example embodiment.

FIG. 1 is a view provided to explain a semiconductor device fabricated by a fabrication method of a semiconductor device according to an example embodiment;

Referring to FIG. 1, the semiconductor device fabricated by a fabrication method of a semiconductor device according to an example embodiment includes a substrate 100, a first wiring layer 110, a first via layer 120 and a second wiring layer 130.

The substrate 100 may be a structure in which a base substrate and an epi-layer (epitaxial layer) are stacked one on the other. The substrate 100 may be a silicon substrate, a gallium arsenide substrate, a silicon germanium substrate, a ceramic substrate, a quartz substrate, or a glass substrate for display, or a semiconductor on insulator (SOI) substrate.

Further, the substrate 100 may include a conductive pattern. The conductive pattern may be a metal wiring or a contact, a gate electrode of a transistor, a source/drain of a transistor, or a diode, for example.

The first wiring layer 110 may be formed on the substrate 100. The first wiring layer 110 may include, for example, a first metal wiring 111, a first barrier film 112, a first capping film 113, and a first interlayer insulating film 114.

The first interlayer insulating film 114 may be formed on the substrate 100. The first interlayer insulating film 114 may be formed to wrap the first metal wiring 111. The first interlayer insulating film 114 may include a first trench T1 formed within the first interlayer insulating film 114.

The first interlayer insulating film 114 may include, for example, at least one of silicon oxide, silicon nitride, silicon oxynitride, and a low-k dielectric material. The first interlayer insulating film 114 may include a low-k dielectric material to alleviate the coupling shape between the wirings.

The low-k dielectric material may include, for example, one or more of flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PE-TEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, or a porous polymeric material.

The first barrier film 112 may be formed along a sidewall and a bottom surface of the first trench T1. The first barrier film 112 may block diffusion of elements contained in the first metal wiring 111 into the first interlayer insulating film 114 or the like, or block diffusion of oxygen contained in the first interlayer insulating film 114 into the first metal wiring 111.

The first barrier film 112 may include, for example, one or more of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), or niobium nitride (NbN).

The first metal wiring 111 may be formed within the first trench T1 by filling the first trench T1. The first metal wiring 111 may be formed on the first barrier film 112. The first metal wiring 111 may be electrically connected to the conductive pattern that can be included in the substrate 100.

The first metal wiring 111 may include one or more of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), or zirconium (Zr). In an example embodiment, the first metal wiring 111 includes copper (Cu).

A liner film may be formed between the first metal wiring 111 and the first barrier film 112.

The liner film may include, for example, one or more of ruthenium (Ru), platinum (Pt), iridium (Ir) and rhodium (Rh). The above described noble metal may include, for example, at least one of ruthenium (Ru), platinum (Pt), iridium (Ir), or rhodium (Rh).

The first capping film 113 may be formed on an upper surface of the first metal wiring 111. The first capping film 113 may be, for example, in direct contact with the first barrier film 112 within the first trench (T1).

Further, although FIG. 1 illustrates that the first capping film 113 covers an upper surface of the first metal wiring 111 entirely, according to an example embodiment, the first capping film 113 may be formed to cover only a portion of an upper surface of the first metal wiring 111.

The first capping film 113 may include one or more of cobalt (Co), ruthenium (Ru), or manganese (Mn), for example.

The first via layer 120 may be formed on the first wiring layer 110. The first via layer 120 may include a first via 121, a first via barrier film 122, a second interlayer insulating film 124, and a first etch stop film 125.

The first etch stop film 125 may be formed on the first wiring layer 110. The first etch stop film 125 may include, for example, one or more of silicon nitride, silicon oxynitride, or silicon carbonitride.

The second interlayer insulating film 124 may be formed on the first etch stop film 125. The second interlayer insulating film 124 and the first etch stop film 125 may be formed to wrap a side surface of the first via 121.

The second interlayer insulating film 124 may include a second trench T2 formed within the second interlayer insulating film 124. The second trench T2 may penetrate through the second interlayer insulating film 124 and the first etch stop film 125 to be formed so that the first capping film 113 can be exposed.

The second interlayer insulating film 124 may include, for example, a same material as the first interlayer insulating film 114, for example, one or more of silicon oxide, silicon nitride, silicon oxynitride, or a low-k dielectric material. According to an example embodiment, the second interlayer insulating film 124 may include a different material from the first interlayer insulating film 114.

The first via barrier film 122 may be formed along a sidewall and a bottom surface of the second trench T2. The first via barrier film 122 may include, for example, one or more of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), or niobium nitride (NbN).

The first via 121 may be formed by filling the second trench T2 within the second trench T2. The first via 121 may be formed on the first via barrier film 122. The first via 121 may be in electrical connection with the first metal wiring 111.

The first via 121 may include one or more of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), or zirconium (Zr). In an example embodiment, the first via 121 includes copper (Cu).

The second wiring layer 130 may be formed on the first via layer 120. The second wiring layer 130 may include a second metal wiring 131, a second barrier film 132, a second capping film 133, and a third interlayer insulating film 134.

The third interlayer insulating film 134 may be formed on the first via layer 120. The third interlayer insulating film 134 may be formed to wrap the second metal wiring 131.

The third interlayer insulating film 134 may be formed to be in direct contact with the second interlayer insulating film 124. According to an example embodiment, an etch stop film may be formed between the third interlayer insulating film 134 and the second interlayer insulating film 124.

The third interlayer insulating film 134 may be formed to cover an upper surface of the second metal wiring 131. According to an example embodiment, an upper surface of the third interlayer insulating film 134 may be formed on the same plane as an upper surface of the second capping film 133 formed on the second metal wiring 131.

The third interlayer insulating film 134 may be formed through chemical vapor deposition (CVD) etc. A formation method of the third interlayer insulating film 134 will be described in detail below.

The third interlayer insulating film 134 may include deuterium (D). Further, the third interlayer insulating film 134 may include, for example, one or more of silicon oxide, silicon nitride, silicon oxynitride, or a low-k dielectric material.

The first interlayer insulating film 114 and the second interlayer insulating film 124 may not include deuterium (D), for example, beyond a naturally occurring amount thereof. For example, a material having added deuterium (D) may not be used in the formation of the first interlayer insulating film 114 and the second interlayer insulating film 124.

The second barrier film 132 may be formed on the first via 121 and the first via barrier film 122. Further, a portion of the second barrier film 132 may be formed on the second interlayer insulating film 124.

The second barrier film 132 may include, for example, one or more of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), or niobium nitride (NbN).

The second metal wiring 131 may be formed on the second barrier film 132. The second metal wiring 131 may be formed to entirely overlap with the second barrier film 132. The second metal wiring 131 may be in electrical connection with the first via 121.

The second metal wiring 131 may include one or more of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), or zirconium (Zr). In an example embodiment, the second metal wiring 131 includes copper (Cu).

The second capping film 133 may be formed on an upper surface of the second metal wiring 131. The second capping film 133 may include one or more of cobalt (Co), ruthenium (Ru), or manganese (Mn), for example.

As illustrated in FIG. 1, the second barrier film 132, the second metal wiring 131 and the second capping film 133 may have a stack shape showing sequential stack one on the other. Thus, sidewalls of the second barrier film 132, the second metal wiring 131, and the second capping film 133 may be respectively formed to be in contact with the third interlayer insulating film. According to an example embodiment, the second barrier film 132 may be formed along a sidewall of the second metal wiring 131.

Hereinbelow, a method for fabricating a semiconductor device according to an example embodiment will be described with reference to FIG. 1 to FIG. 7.

Figure 2:
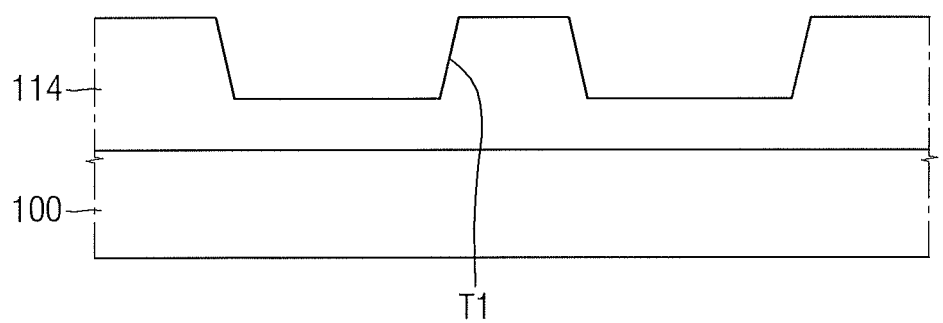
FIG. 2 to FIG. 7 are views illustrating intermediate stages of fabrication, provided to explain a method for fabricating a semiconductor device according to an example embodiment.

FIG. 2 to FIG. 7 are views illustrating intermediate stages of fabrication, provided to explain a method for fabricating a semiconductor device according to an example embodiment;

Referring to FIG. 2, a first interlayer insulating film 114 may be formed on the substrate 100. The first interlayer insulating film 114 may be formed by, for example, chemical vapor deposition (CVD), spin coating, thermal CVD, plasma enhanced CVD (PECVD), high density plasma CVD (HDP-CVD), etc.

Next, the first trench T1 may be formed within the first interlayer insulating film 114 by etching the first interlayer insulating film 114 with a mask pattern. As a result, the first interlayer insulating film 114 including the first trench T1 may be formed on the substrate 100.

Although FIG. 2 illustrates that the first trench T1 is formed so as not to expose the substrate 100 with the first trench T1, according to an example embodiment, the first trench T1 may be formed to expose the substrate 100 by penetrating through the first interlayer insulating film 114.

According to an example embodiment, the first trench T1 may be formed by etching the etch stop film and the first interlayer insulating film 114 with the mask pattern after the etch stop film and the first interlayer insulating film 114 are stacked sequentially on the substrate 100.

Figure 3:
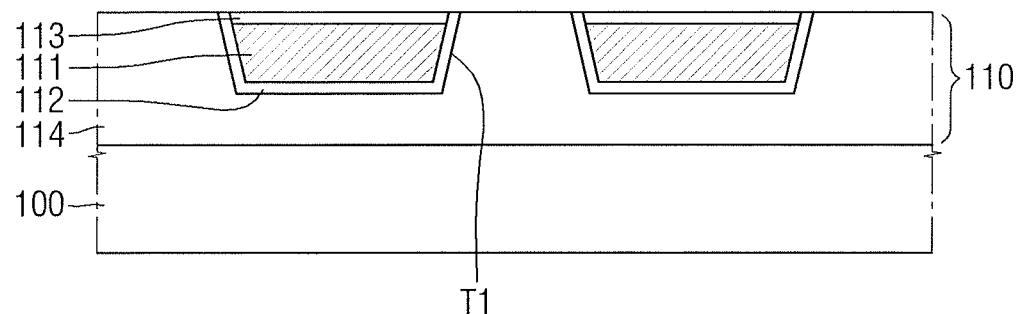

Referring to FIG. 3, the first barrier film 112 may be formed along a sidewall and a bottom surface of the first trench T1 within the first trench T1.

Next, the first wiring layer 110 may be formed as the first metal wiring 111 is formed on the first barrier film 112, and then, the first capping film 113 is formed on the first metal wiring 111 so as to fill the first trench T1.

Figure 4:
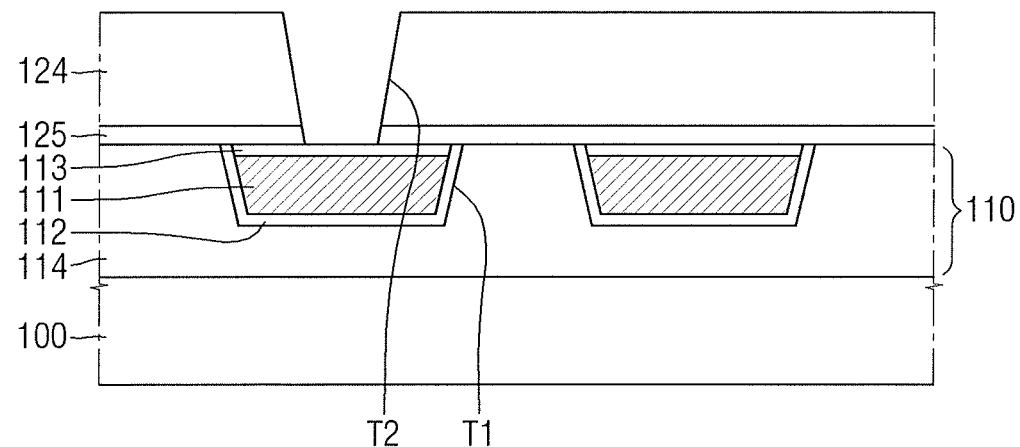

Referring to FIG. 4, the first etch stop film 125 and the second interlayer insulating film 124 may be sequentially stacked on the first wiring layer 110.

The first etch stop film 125 may be formed using, for example, chemical vapor deposition (CVD), etc. The second interlayer insulating film 124 may be formed using, for example, chemical vapor deposition (CVD), spin coating, thermal CVD, plasma enhanced CVD (PECVD), high density plasma CVD (HDP-CVD), etc.

Next, the second trench T2 may be formed so as to expose the first capping film 113 within the second interlayer insulating film 124 by etching the second interlayer insulating film 124 and the first etch stop film 125 with the mask pattern. As a result, the second interlayer insulating film 124 including the second trench T2 may be formed on the first wiring layer 110.

Figure 5:
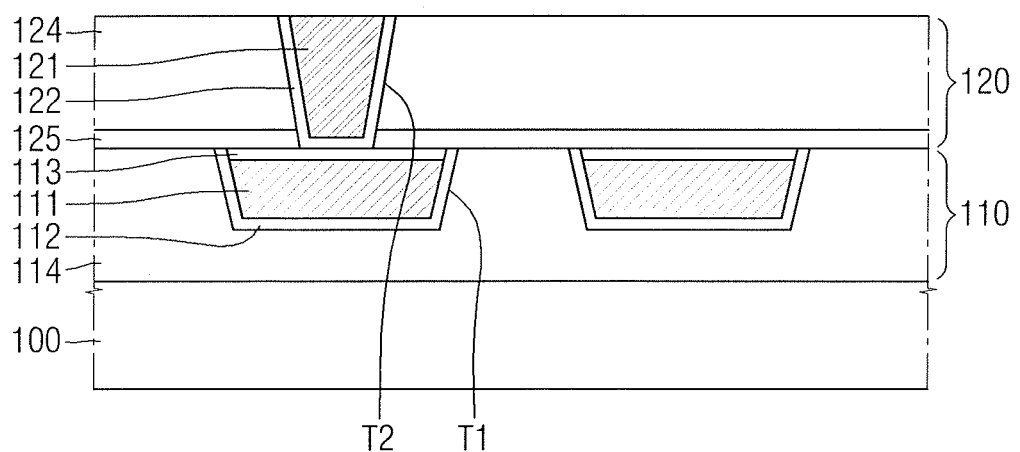

Referring to FIG. 5, the first via barrier film 122 may be formed along a sidewall and a bottom surface of the second trench T2 within the second trench T2.

Next, the first via layer 120 may be formed as the first via 121 is formed on the first via barrier film 122 so as to fill the second trench T2.

Figure 6:
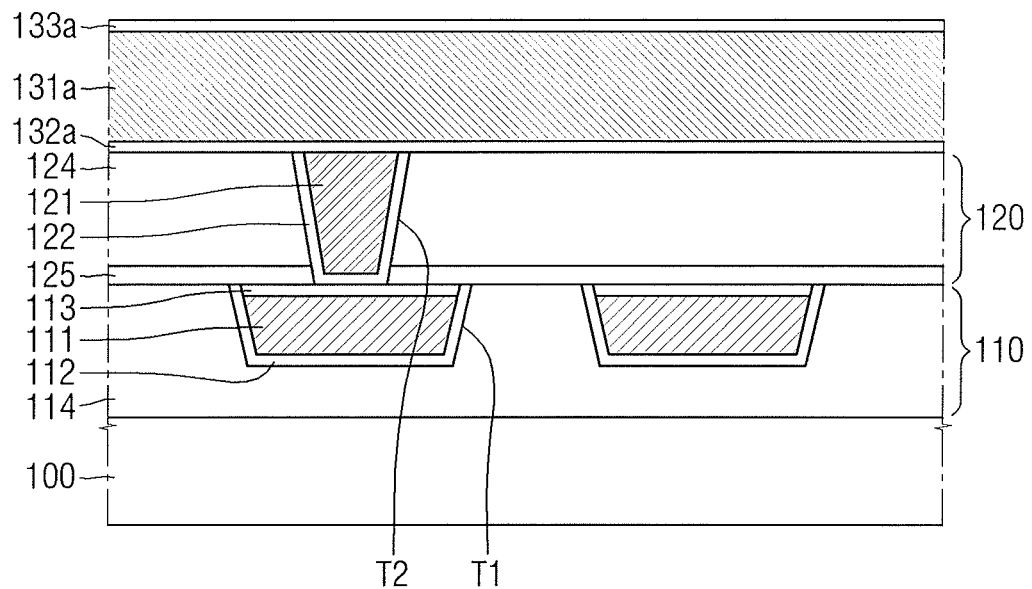

Referring to FIG. 6, the second barrier film material 132a, the second metal wiring material 131a and the second capping film material 133a may be sequentially stacked on the first via layer 120.

Figure 7:
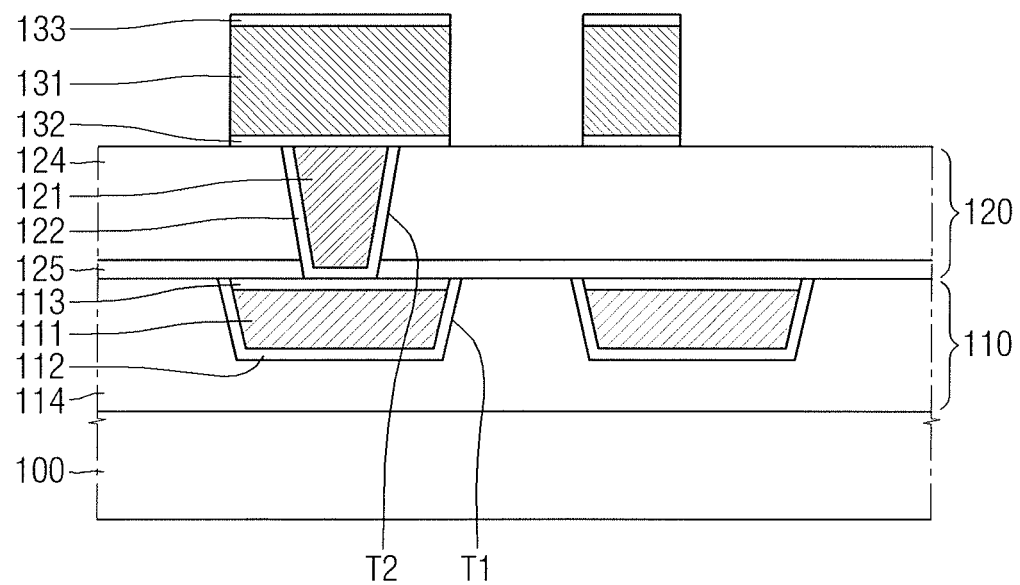

Referring to FIG. 7, a stack of the second barrier film 132, the second metal wiring 131, and the second capping film 133, which are stacked in a sequential order on the first via layer 120, may be formed by etching the second barrier film material 132a, the second metal wiring material 131a, and the second capping film material 133a with the mask pattern.

For convenience of explanation, FIG. 7 illustrates that the two stacks of the second barrier film 132, the second metal wiring 131, and the second capping film 133 are stacked in a sequential order on the first via layer 120, and offset.

Referring back to FIG. 1, the third interlayer insulating film 134 may be formed on the first via layer 120. For example, the third interlayer insulating film 134 may be formed to cover a side surface and an upper surface of the second metal wiring 131. For example, the third interlayer insulating film 134 may be formed to cover a sidewall of the second barrier film 132, a sidewall of the second metal wiring 131, a sidewall and an upper surface of the second capping film 133.

The third interlayer insulating film 134 may be formed using, for example, chemical vapor deposition (CVD), thermal CVD, plasma enhanced CVD (PECVD), high density plasma CVD (HDP-CVD), etc. The third interlayer insulating film 134 may be formed at a process temperature less than 450° C. when being formed using, for example, HDP-CVD.

For example, the third interlayer insulating film 134 may be formed through CVD using a first gas containing deuterium (D) (e.g., one or more deuterium atoms) and a second gas containing hydrogen (H) (e.g., one or more hydrogen atoms). As a result, the third interlayer insulating film 134 may include deuterium (D).

The first gas may include, for example, one or more of $SiD_4$, $D_2$, $D_2O$, $HD_3$, $Si_2D_6$, or $(C_2H_5)_3SiD$.

The second gas may include, for example, $SiH_4$.

According to an example embodiment, a carrier gas may be used in addition to the first gas containing deuterium (D) and the second gas containing hydrogen (H). The carrier gas may include, for example, one or more of Ar, $O_2$, $N_2$, $H_2$, $D_2$, $D_2O$, $HD_3$, $ND_3$, NDHe, $O_3$, $NH_3$, Kr, or Xe.

Provision of the first gas containing deuterium (D) and the second gas containing hydrogen (H) and execution of CVD may be simultaneously performed. As a result, while the third interlayer insulating film 134 is formed through CVD, deuterium (D) may be provided through the second metal wiring 131, the first via 121, and the first metal wiring 111.

Reliability of a semiconductor device may be enhanced and characteristics of film material may be improved by forming the third interlayer insulating film 134 through CVD using hydrogen (H) and deuterium (D).

The semiconductor device illustrated in FIG. 1 may be fabricated through the above-described fabrication method. Although this specification describes that CVD using hydrogen (H) and deuterium (D) is used in forming the interlayer insulating film wrapping the metal wiring, according to an example embodiment, another dielectric film such as gate insulating film may be formed through CVD using hydrogen (H) and deuterium (D).

Hereinafter, a method for fabricating a semiconductor device according to an example embodiment will be described with reference to FIG. 8. The difference from the method for fabricating the semiconductor device illustrated in FIG. 1 to FIG. 7 will be highlighted.

Figure 8:
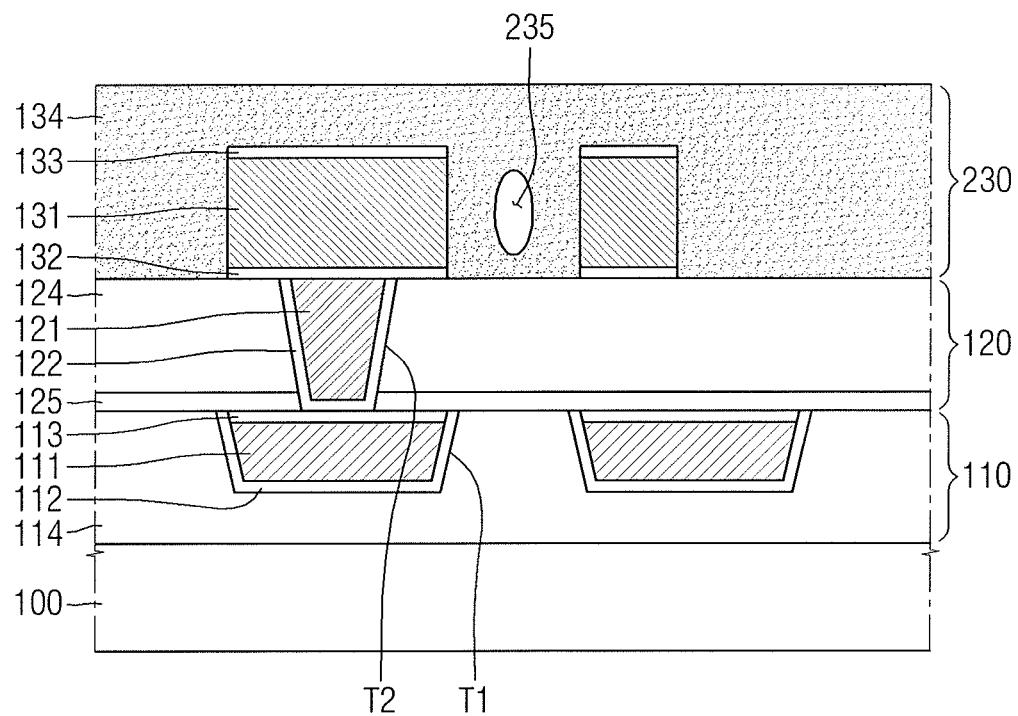
FIG. 8 illustrates a view provided to explain a semiconductor device fabricated by a fabrication method of a semiconductor device according to an example embodiment.

FIG. 8 is a view provided to explain a semiconductor device fabricated by a fabrication method of a semiconductor device according to an example embodiment;

Referring to FIG. 8, the third interlayer insulating film 134 may be formed on the first via layer 120 after a process illustrated in FIG. 7 is executed. According to the present example embodiment, an air-gap 235 may be formed within the third interlayer insulating film 134.

The air-gap 235 may be formed between the two stacks (which are displaced from one another and formed by sequentially stacking the second barrier film 132, the second metal wiring 131, and the second capping film 133). Thus, the air-gap 235 may be formed between two second metal wirings 131 within the second wiring layer 230.

Hereinbelow, a method for fabricating a semiconductor device according to an example embodiment will be described with reference to FIG. 9 and FIG. 10. The difference from the method for fabricating the semiconductor device illustrated in FIG. 1 to FIG. 7 will be highlighted.

Figure 9:
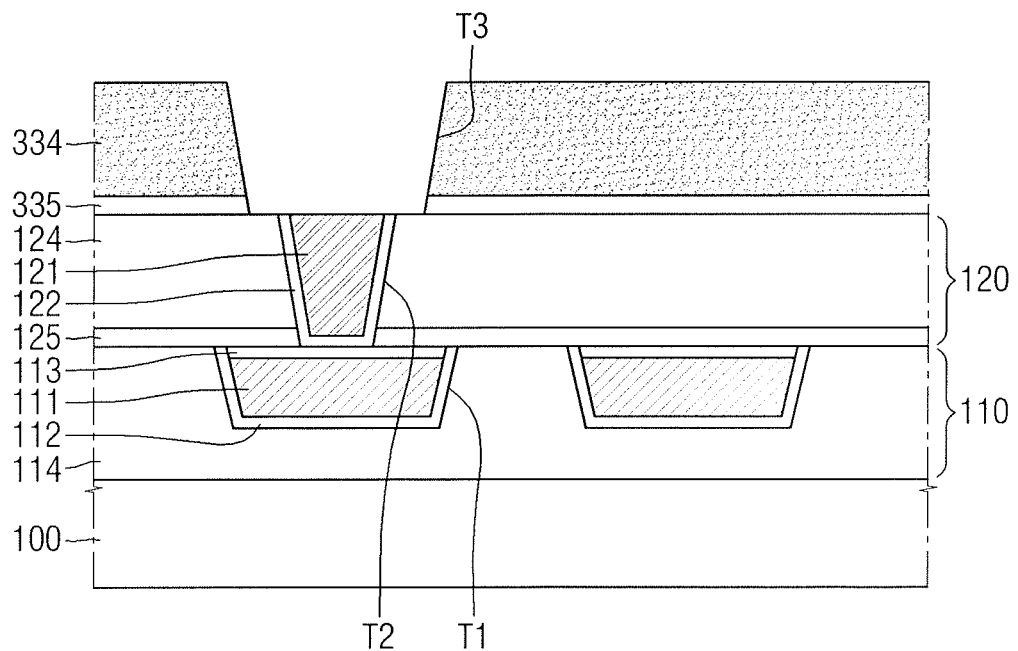
FIG. 9 and FIG. 10 are views illustrating intermediate stages of fabrication, provided to explain a method for fabricating a semiconductor device according to an example embodiment.
Figure 10:
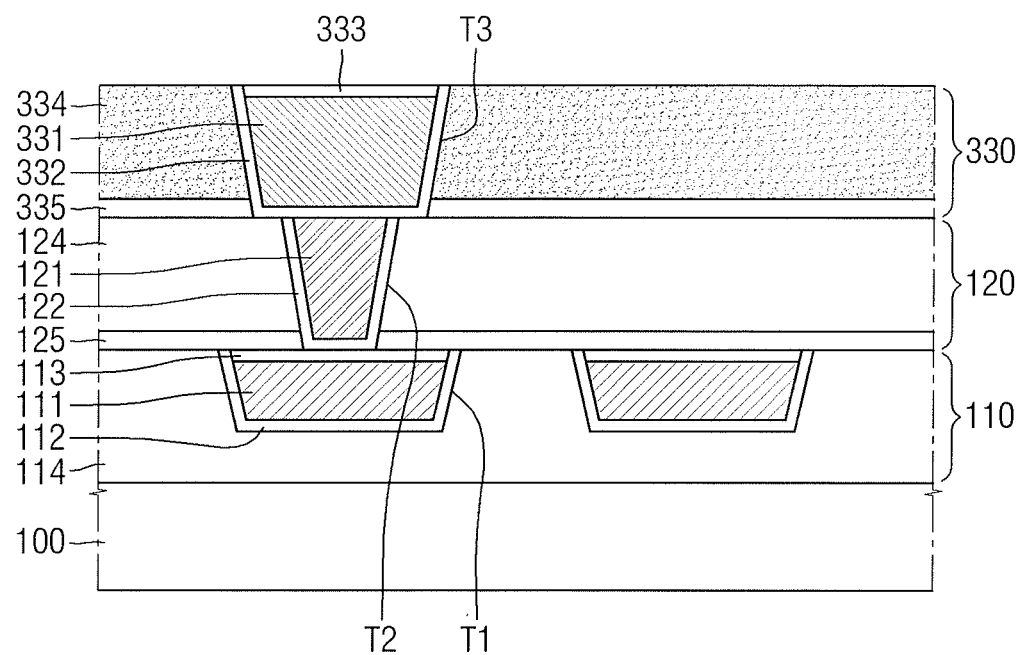

FIG. 9 and FIG. 10 are views illustrating intermediate stages of fabrication, provided to explain a method for fabricating a semiconductor device according to an example embodiment;

Referring to FIG. 9, the second etch stop film 335 and the third interlayer insulating film 334 may be sequentially stacked on the first via layer 120 after the process illustrated in FIG. 5 is performed.

The third interlayer insulating film 334 may be formed through CVD using the first gas containing deuterium (D) and the second gas containing hydrogen (H).

Next, a third trench T3 may be formed so as to expose an upper surface of the first via 121 within the third interlayer insulating film 334 by etching the third interlayer insulating film 334 and the second etch stop film 335 with the mask pattern. As a result, the third interlayer insulating film 334 including the third trench T3 may be formed on the first via layer 120.

Referring to FIG. 10, the second barrier film 332 may be formed along a sidewall and a bottom surface of the third trench T3 within the third trench T3.

Next, the second wiring layer 330 may be formed as the second metal wiring 331 is formed on the second barrier film 332, and then, the second capping film 333 is formed on the second metal wiring 331 so as to fill the third trench T3.

In this case, an upper surface of the second capping film 333 may be formed on the same plane as an upper surface of the third interlayer insulating film 334, for example.

Hereinbelow, a method for fabricating a semiconductor device according to an example embodiment will be described with reference to FIG. 11 and FIG. 12. The difference from the method for fabricating the semiconductor device illustrated in FIG. 1 to FIG. 7 will be highlighted.

Figure 11:
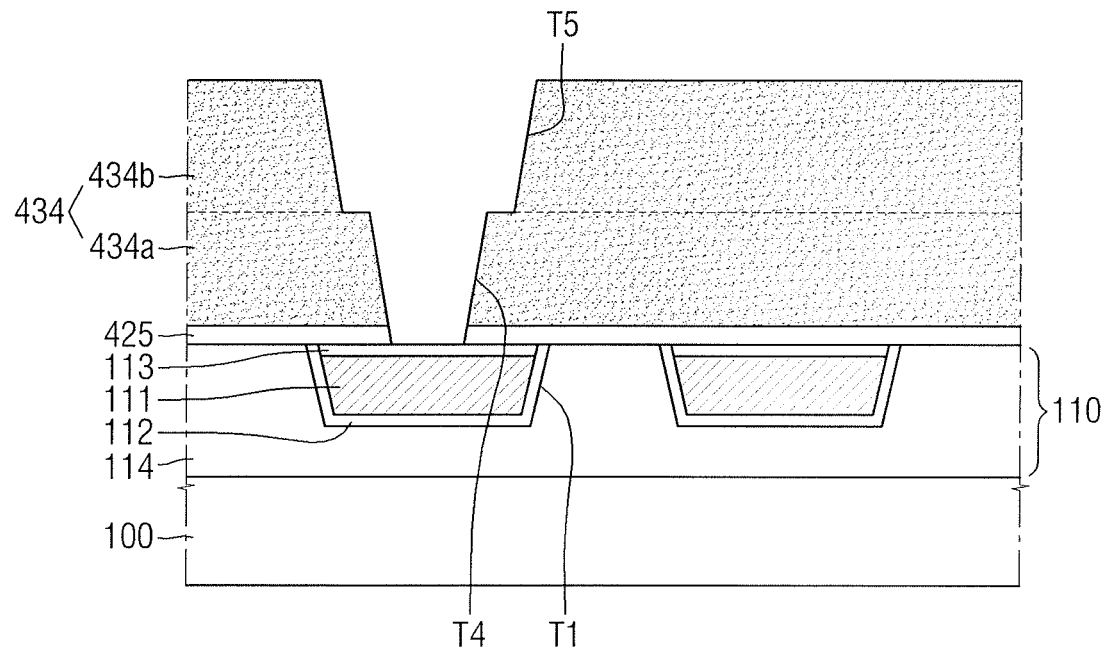
FIG. 11 and FIG. 12 are views illustrating intermediate stages of fabrication, provided to explain a method for fabricating a semiconductor device according to an example embodiment.
Figure 12:
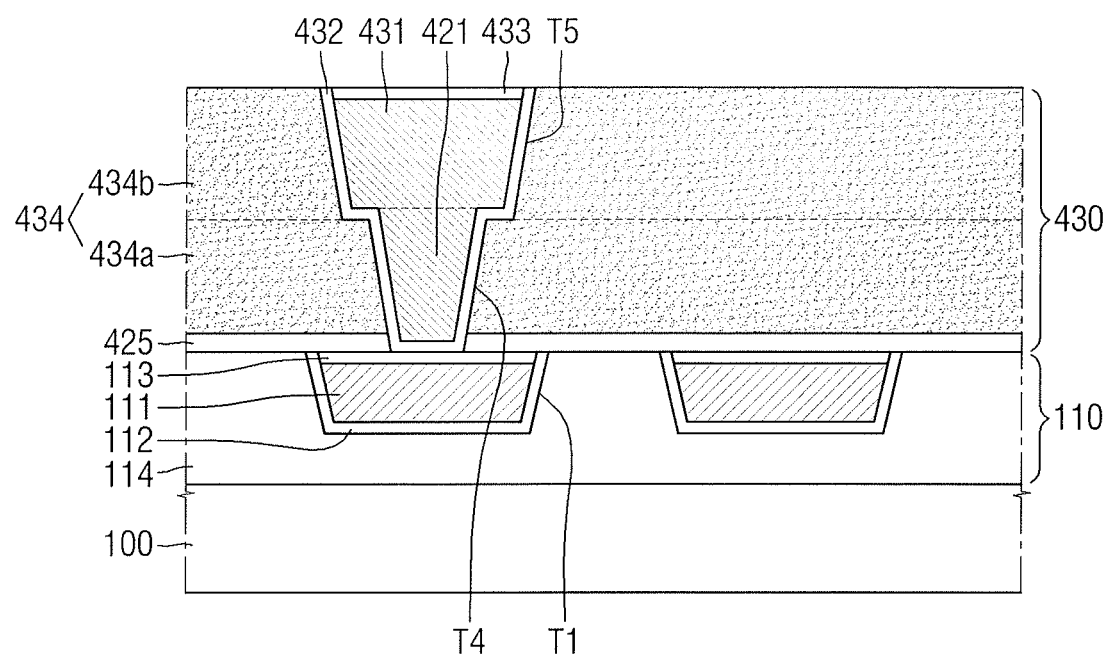

FIG. 11 and FIG. 12 are views illustrating intermediate stages of fabrication, provided to explain a method for fabricating a semiconductor device according to an example embodiment;

Referring to FIG. 11, the first etch stop film 425 and the third interlayer insulating film 434 may be sequentially stacked on the first wiring layer 110 after the process illustrated in FIG. 3 is executed.

The third interlayer insulating film 434 may be formed through CVD using the first gas containing deuterium (D) and the second gas containing hydrogen (H).

Next, a fourth trench T4 and a fifth trench T5 on the fourth trench T4 may be formed so as to expose an upper surface of the first capping film 113 within the third interlayer insulating film 434 by etching the third interlayer insulating film 434 and the first etch stop film 425 with the mask pattern.

The fourth trench T4 may be formed within a lower portion 434a of the third interlayer insulating film and the fifth trench T5 may be formed within an upper portion 434b of the third interlayer insulating film. A width of the fifth trench T5 may be formed to be greater than a width of the fourth trench T4.

According to an example embodiment, the fourth trench T4 may be first formed, and then, the fifth trench T5 may be formed. In another example embodiment, the fifth trench T5 may be formed first and then the fourth trench T4 may be formed.

Referring to FIG. 12, the second barrier film 432 may be formed along a sidewall and a bottom surface of each of the fourth and fifth trenches T4, T5 within the fourth and fifth trenches T4, T5.

Next, the first via 421 may be formed on the second barrier film 432 so as to fill the fourth trench T4, and the second metal wiring 431 may be formed on the second barrier film 432 and the first via 421 so as to fill the fifth trench T5.

The first via 421 and the second metal wiring 431 may be formed through the same process. The first via 421 and the second metal wiring 431 may include a same material.

Next, the second wiring layer 430 may be formed as the second capping film 433 is formed on the second metal wiring 431.

Hereinbelow, a method for fabricating a semiconductor device according to an example embodiment will be described with reference to FIG. 13 to FIG. 16. The difference from the method for fabricating the semiconductor device illustrated in FIG. 1 to FIG. 7 will be highlighted.

Figure 13:
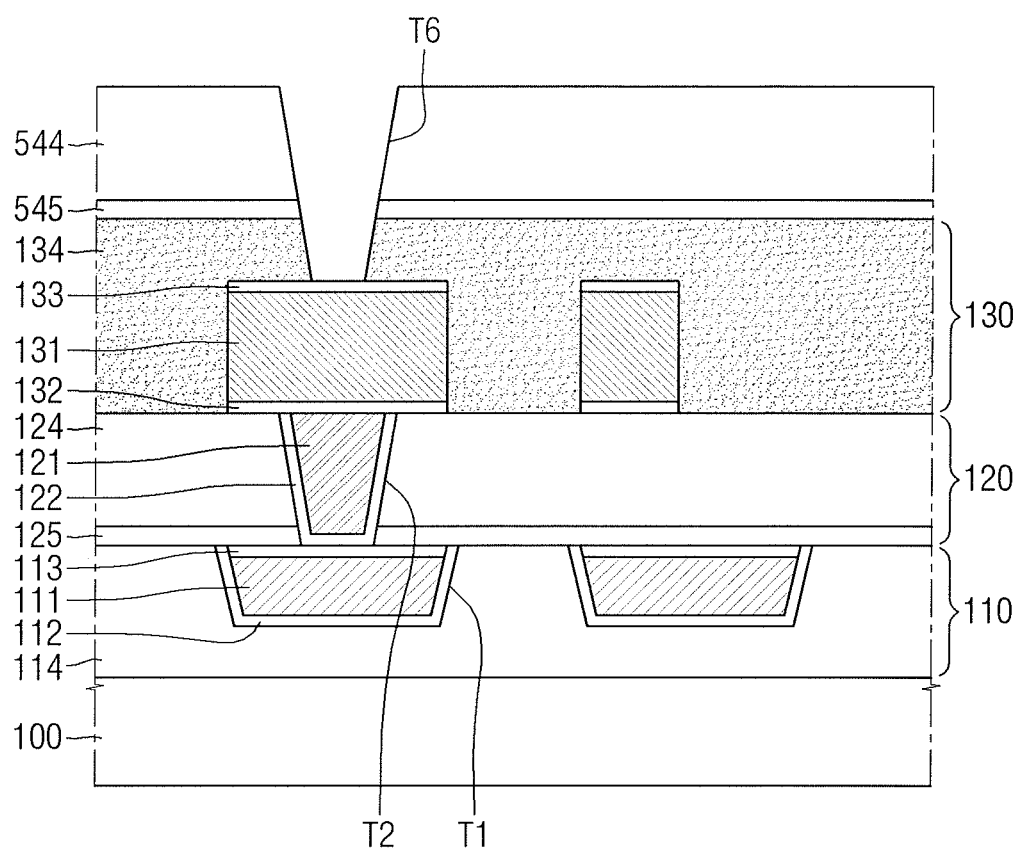
FIG. 13 and FIG. 16 are views illustrating intermediate stages of fabrication, provided to explain a method for fabricating a semiconductor device according to an example embodiment.
Figure 16:
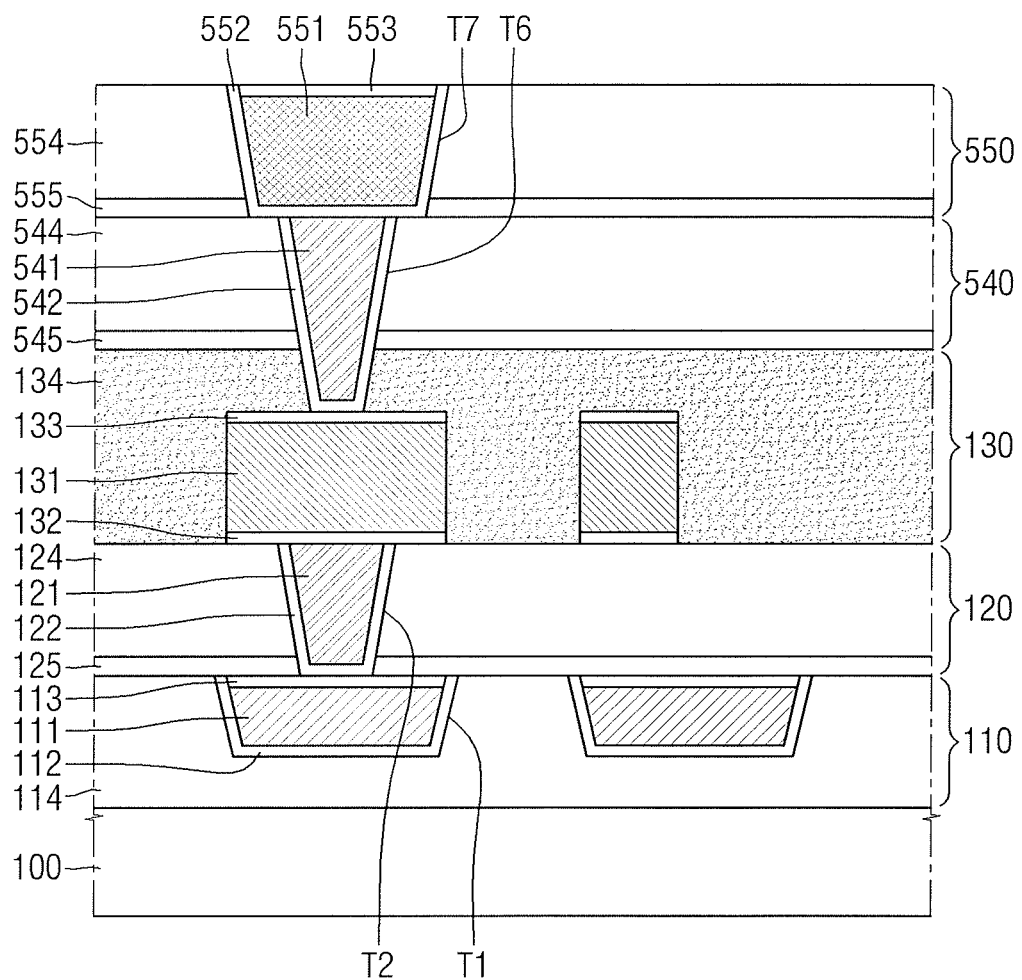

FIG. 13 and FIG. 16 are views illustrating intermediate stages of fabrication, provided to explain a method for fabricating a semiconductor device according to an example embodiment;

Referring to FIG. 13, the third etch stop film 545 and the fourth interlayer insulating film 544 may be sequentially stacked on the second wiring layer 130 after the semiconductor device illustrated in FIG. 1 is fabricated.

The third etch stop film 545 may include, for example, one or more of silicon nitride, silicon oxynitride, silicon carbonitride, etc. The fourth interlayer insulating film 544 may include a same material as in the first and second interlayer insulating films 114, 124, for example, one or more of silicon oxide, silicon nitride, silicon oxynitride, or a low-k dielectric material.

Each of the third etch stop film 545 and the fourth interlayer insulating film 544 may be formed, for example, through CVD, etc.

Next, a sixth trench T6 may be formed so as to expose an upper surface of the second capping film 133 within the fourth interlayer insulating film 544 by etching a portion of the fourth interlayer insulating film 544, the third etch stop film 545, and the third interlayer insulating film 134 with the mask pattern. As a result, the fourth interlayer insulating film 544 including the sixth trench T6 may be formed on the second wiring layer 130.

Figure 14:
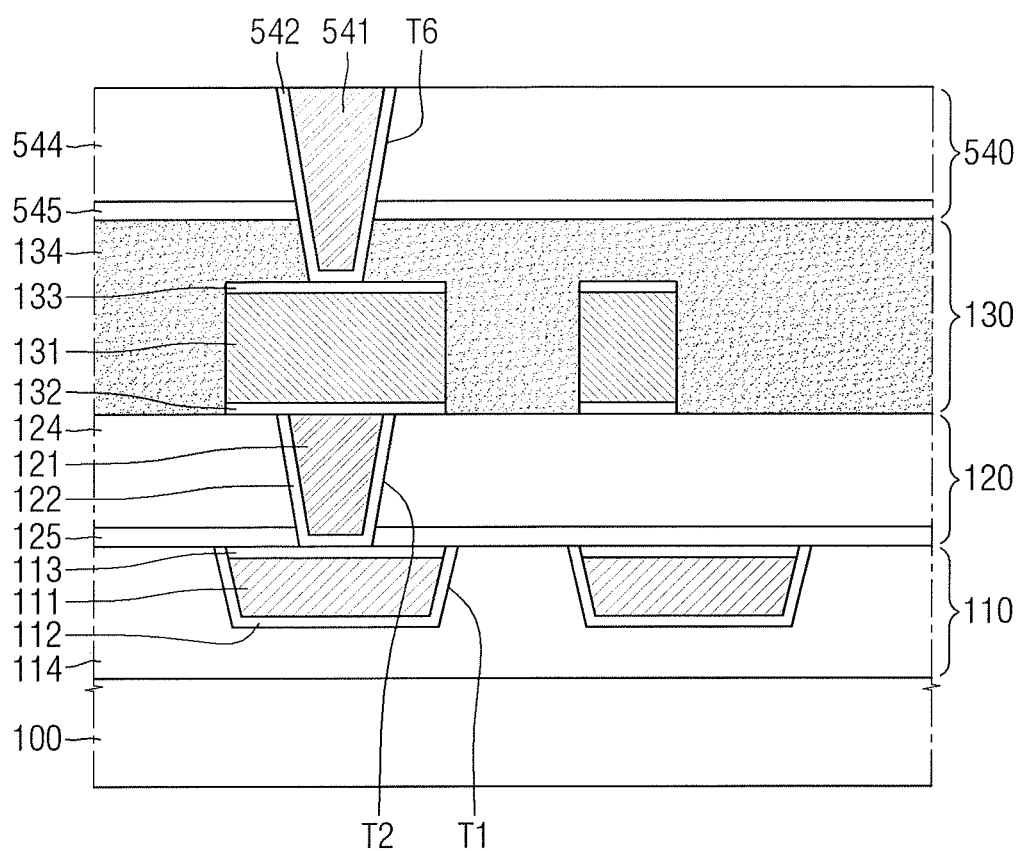
Figure 15:
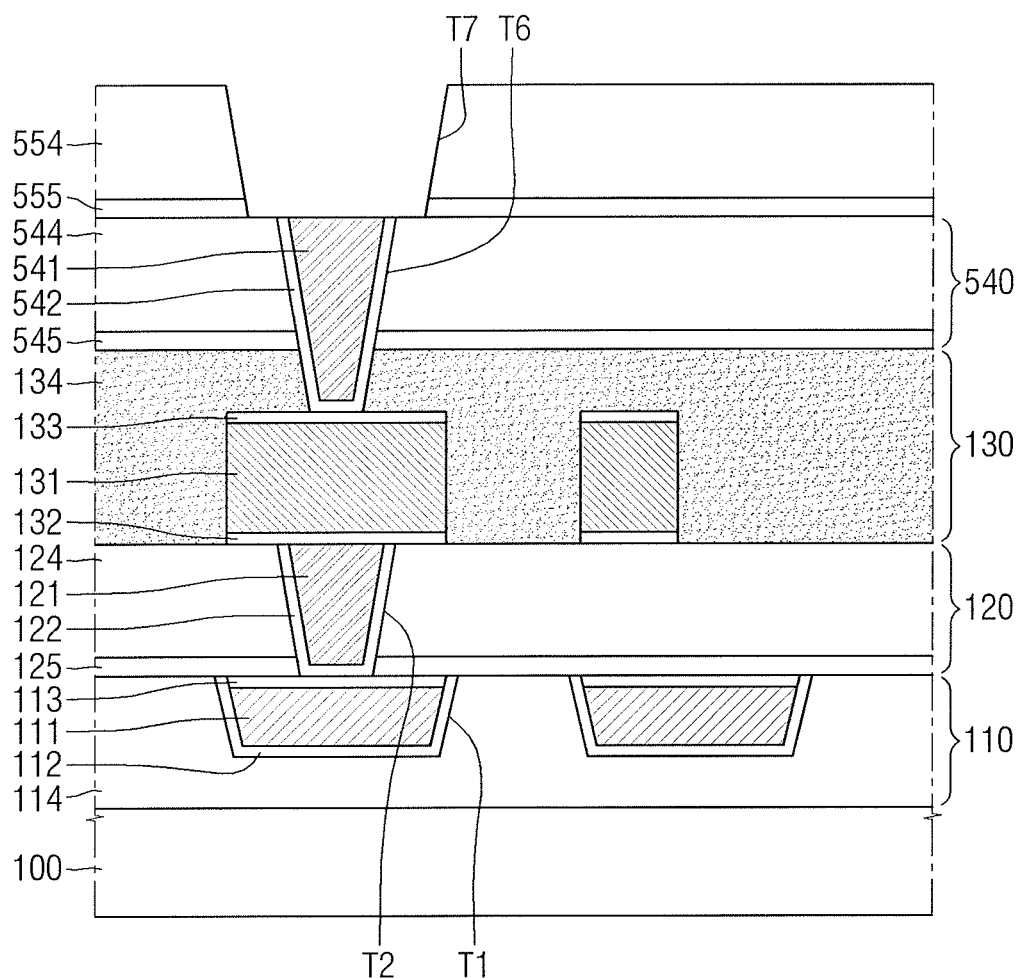

Referring to FIG. 14, the second via barrier film 542 may be formed along a sidewall and a bottom surface of the sixth trench T6 within the sixth trench T6.

Next, the second via layer 540 may be formed as the second via 541 is formed on the second via barrier film 542 so as to fill the sixth trench T6.

The second via 541 may be in electrical connection with the second metal wiring 131. For example, the second via 541 may include one or more of carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), or zirconium (Zr).

Referring to 15, the fourth etch stop film 555 and the fifth interlayer insulating film 554 may be sequentially stacked on the second via layer 540.

The fourth etch stop film 555 may include, for example, one or more of silicon nitride, silicon oxynitride, silicon carbonitride, etc. The fifth interlayer insulating film 554 may include a same material as the first, second and fourth interlayer insulating films 114, 124, 544, for example, one or more of silicon oxide, silicon nitride, silicon oxynitride, or a low-k dielectric material.

Each of the fourth etch stop film 555 and the fifth interlayer insulating film 554 may be formed, for example, through CVD, etc.

Next, a seventh trench T7 may be formed so as to expose an upper surface of the second via 541 within the fifth interlayer insulating film 554 by etching the fifth interlayer insulating film 554 and the fourth etch stop film 555 with the mask pattern. As a result, the fifth interlayer insulating film 554 including the seventh trench T7 may be formed on the second via layer 540.

Referring to FIG. 16, the third barrier film 552 may be formed along a sidewall and a bottom surface of the seventh trench T7 within the seventh trench T7.

Next, the third wiring layer 550 may be formed as the third metal wiring 551 is formed on the third barrier film 552, and then, the third capping film 553 is formed on the third metal wiring 551 so as to fill the seventh trench T7.

The third metal wiring 551 may be in electrical connection with the second via 541. The third metal wiring 551 may include, for example, one or more of carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), or zirconium (Zr).

In an example embodiment, an upper surface of the third capping film 553 may be formed on the same plane as an upper surface of the fifth interlayer insulating film 554, for example.

Hereinbelow, a method for fabricating a semiconductor device according to an example embodiment will be described with reference to FIG. 17 and FIG. 18. The difference from the method for fabricating the semiconductor device illustrated in FIG. 1 to FIG. 7 will be highlighted.

Figure 17:
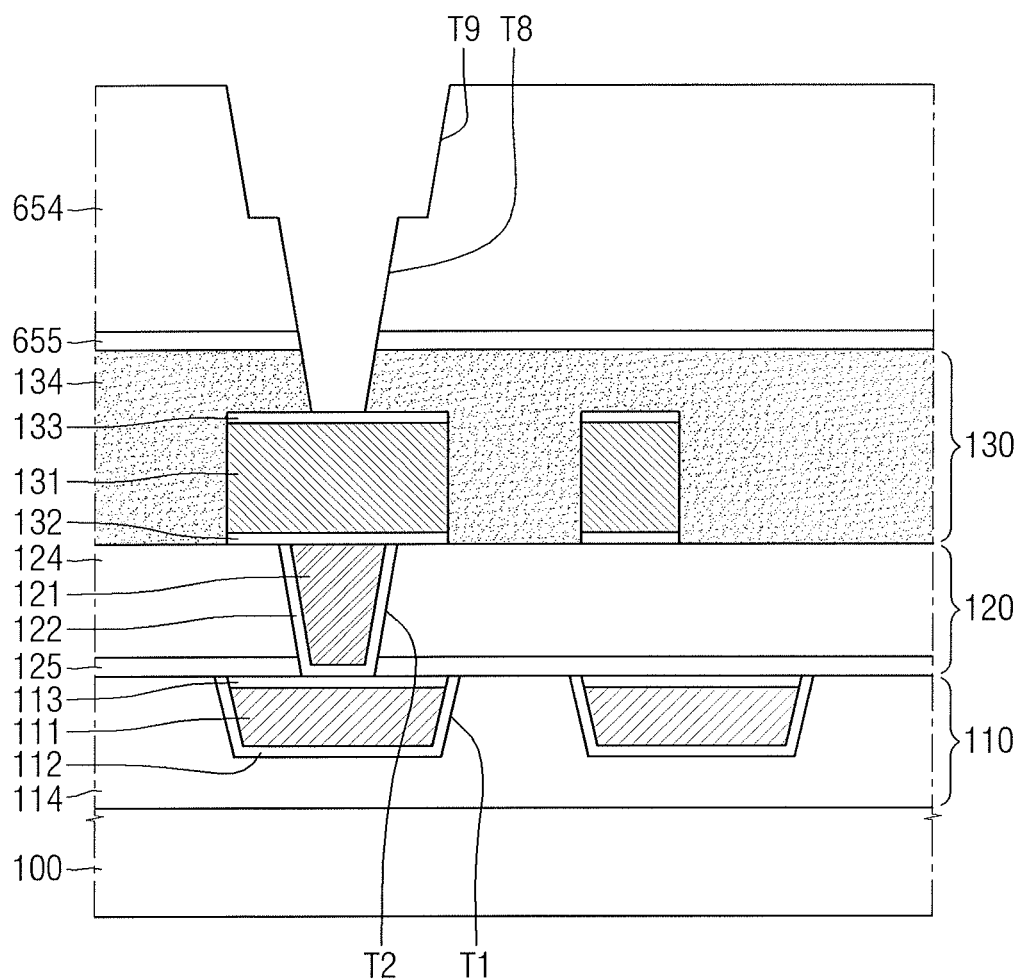
FIG. 17 and FIG. 18 are views illustrating intermediate stages of fabrication, provided to explain a method for fabricating a semiconductor device according to an example embodiment.
Figure 18:
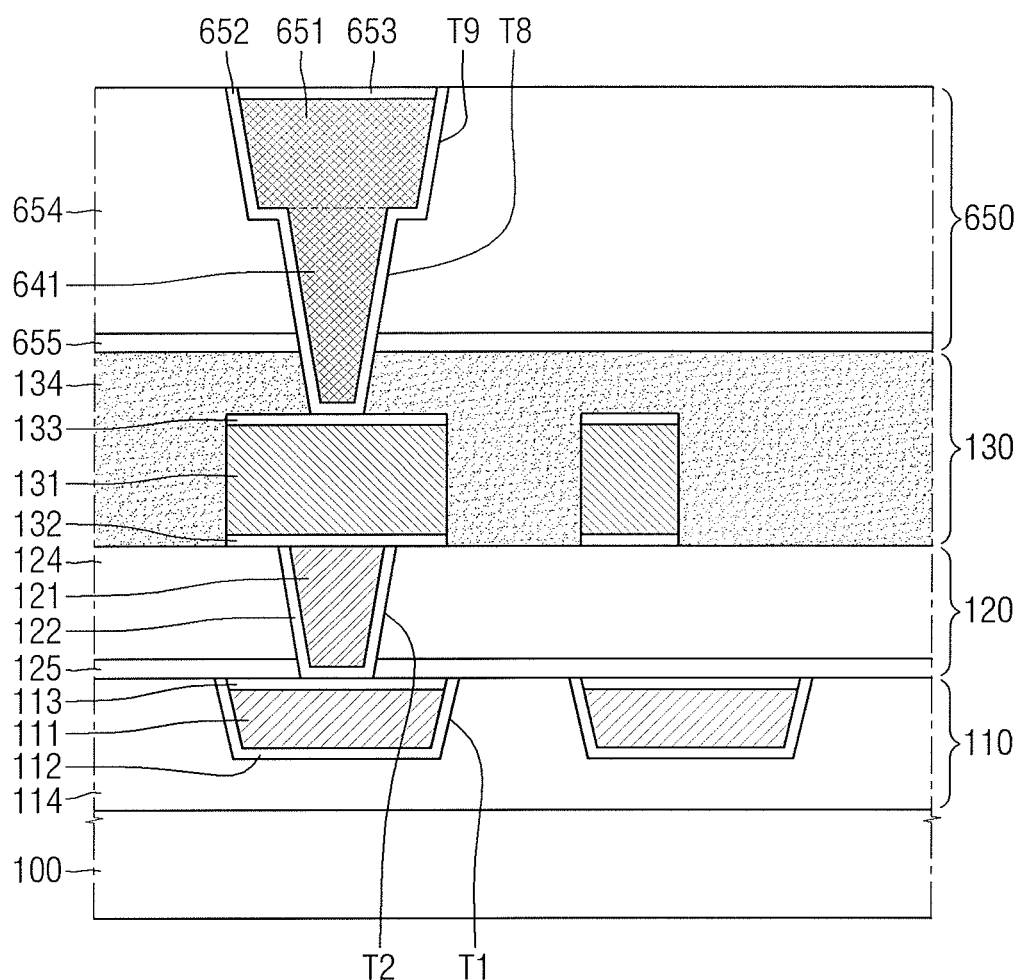

FIG. 17 and FIG. 18 are views illustrating intermediate stages of fabrication, provided to explain a method for fabricating a semiconductor device according to an example embodiment;

Referring to FIG. 17, the third etch stop film 655 and the sixth interlayer insulating film 654 may be sequentially stacked on the second wiring layer 130 after the semiconductor device illustrated in FIG. 1 is fabricated.

Next, an eighth trench T8 and a ninth trench T9 on the eighth trench T8 may be formed so as to expose an upper surface of the second capping film 133 within the sixth interlayer insulating film 654 by etching the sixth interlayer insulating film 654 and the third etch stop film 655 with the mask pattern.

The eighth trench T8 may be formed within the third interlayer insulating film 134 and the sixth interlayer insulating film 654, and the ninth trench T9 may be formed within the sixth interlayer insulating film 654. A width of the ninth trench T9 may be formed to be greater than a width of the eighth trench T8.

According to an example embodiment, the eighth trench T8 may be first formed, and then, the ninth trench T9 may be formed. In another example embodiment, the ninth trench T9 may be formed first and then the eighth trench T8 may be formed.

Referring to FIG. 18, the fourth barrier film 652 may be formed along a sidewall and a bottom surface of each of the eighth and ninth trenches T8, T9 within the eighth and ninth trenches T8, T9.

Next, the third via 641 may be formed on the fourth barrier film 652 so as to fill the eighth trench T8, and the fourth metal wiring 651 may be formed on the fourth barrier film 652 and the third via 641 so as to fill the fifth trench T5.

Each of the third via 641 and the fourth metal wiring 651 may be in electrical connection with the second metal wiring 131.

The third via 641 and the fourth metal wiring 651 may be formed through the same process. The third via 641 and the fourth metal wiring 651 may include a same material.

Next, the fourth wiring layer 650 may be formed as the fourth capping film 653 is formed on the fourth metal wiring 651.

In the present example embodiment, an upper surface of the fourth capping film 653 may be formed on the same plane as an upper surface of the sixth interlayer insulating film 654.

By way of summation and review, leakage or the like may occur as a space between circuit constituent elements (such as wirings) decreases. For enhancement of the element operation characteristics in a semiconductor integrated circuit, attention is being given to hydrogen passivation, leakage of a dielectric film, and film material characteristics with respect to a dielectric film (for example, gate insulating film or interlayer insulating film).

As described above, embodiments may provide a method for fabricating a semiconductor device enhanced with characteristics of film material in a dielectric film. According to an example embodiment, a dielectric film wrapping metal wirings may be formed through chemical vapor deposition (CVD) using hydrogen (H) and deuterium (D), which may enhance reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a substrate;
    a first interlayer insulating layer disposed on the substrate;
    a lower wiring disposed in the first interlayer insulating layer and including copper;
    a first insulating layer disposed on the first interlayer insulating layer and including at least one of silicon nitride, silicon oxynitride, and silicon carbon nitride;
    a second interlayer insulating layer disposed on the first insulating layer;
    a contact structure passing through the second interlayer insulating layer and the first insulating layer, and contacting the lower wiring, the contact structure including tungsten;
    a third interlayer insulating layer disposed on and contacting the second interlayer insulating layer;
    a first upper wiring disposed in the third interlayer insulating layer and contacting the contact structure, the first upper wiring including aluminum; and
    a second insulating layer disposed on and contacting the third interlayer insulating layer, the second insulating layer including at least one of silicon nitride, silicon oxynitride, and silicon carbon nitride, wherein:
    the third interlayer insulating layer includes deuterium, and
    a top surface of the first upper wiring is disposed lower than a top surface of the third interlayer insulating layer.

2. The semiconductor device of claim 1, further comprising a second upper wiring that is disposed adjacent to the first upper wiring and in the third interlayer insulating layer, wherein the third interlayer insulating layer includes an air gap that is disposed between the first upper wiring and the second upper wiring.

3. The semiconductor device of claim 1, wherein the top surface and a side surface of the first upper wiring are in contact with the third interlayer insulating layer.

4. The semiconductor device of claim 1, wherein a bottom surface of the first upper wiring is substantially coplanar with a top surface of the second interlayer insulating layer.

5. The semiconductor device of claim 1, wherein a top surface of the lower wiring is substantially coplanar with a top surface of the first interlayer insulating layer.

6. The semiconductor device of claim 1, wherein:
    the first upper wiring includes a first wiring pattern, a second wiring pattern that is disposed on the first wiring pattern, and a third wiring pattern that is disposed on the second wiring pattern,
    a bottom surface of the first wiring pattern of the first upper wiring contacts a top surface of the contact structure and a top surface of the second interlayer insulating layer, and
    a top surface of the third wiring pattern of the first upper wiring contacts the third interlayer insulating layer.

7. The semiconductor device of claim 6, wherein a side surface of each of the first wiring pattern, the second wiring pattern, and the third wiring pattern of the first upper wiring contacts the third interlayer insulating layer.

8. The semiconductor device of claim 1, wherein a bottom surface of the first insulating layer contacts a top surface of the lower wiring.

9. The semiconductor device of claim 1, wherein a top surface of the contact structure is substantially coplanar with a top surface of the second interlayer insulating layer.

10. The semiconductor device of claim 1, further comprising a third upper wiring that passes through a portion of the third interlayer insulating layer and the second insulating layer, and contacts the top surface of the first upper wiring, wherein the third upper wiring extends over the top surface of the third interlayer insulating layer.

11. A semiconductor device, comprising:
    a substrate;
    a first interlayer insulating layer disposed on the substrate;
    a lower wiring disposed in the first interlayer insulating layer;
    a first insulating layer disposed on the first interlayer insulating layer;
    a second interlayer insulating layer disposed on the first insulating layer;
    a contact structure passing through the second interlayer insulating layer and the first insulating layer, and contacting the lower wiring;
    a third interlayer insulating layer disposed on and contacting the second interlayer insulating layer;
    a first upper wiring disposed in the third interlayer insulating layer and contacting the contact structure; and
    a second insulating layer disposed on and contacting the third interlayer insulating layer, wherein:
    the lower wiring is electrically connected to the substrate,
    a top surface of the lower wiring is substantially coplanar with a top surface of the first interlayer insulating layer and contacts a bottom surface of the first insulating layer, a top surface of the contact structure is substantially coplanar with a top surface of the second interlayer insulating layer, the third interlayer insulating layer includes deuterium, a bottom surface of the first upper wiring contacts the top surface of the contact structure and the top surface of the second interlayer insulating layer; and a top surface and a side surface of the first upper wiring are in contact with the third interlayer insulating layer.

12. The semiconductor device of claim 11, wherein the top surface of the first upper wiring is disposed lower than a top surface of the third interlayer insulating layer.

13. The semiconductor device of claim 11, further comprising a second upper wiring that is disposed adjacent to the first upper wiring and in the third interlayer insulating layer, wherein the third interlayer insulating layer includes an air gap that is disposed between the first upper wiring and the second upper wiring.

14. The semiconductor device of claim 11, further comprising a third upper wiring that passes through a portion of the third interlayer insulating layer and the second insulating layer, and contacts the top surface of the first upper wiring, wherein the third upper wiring extends over a top surface of the third interlayer insulating layer.

15. The semiconductor device of claim 11, wherein each of the first insulating layer and the second insulating layer includes at least one of silicon nitride, silicon oxynitride, and silicon carbon nitride.

16. The semiconductor device of claim 11, wherein the lower wiring includes copper, the first upper wiring includes aluminum, and the contact structure includes tungsten.

17. A semiconductor device, comprising:
a substrate;
a first interlayer insulating layer disposed on the substrate;
a lower wiring disposed in the first interlayer insulating layer and electrically connected to the substrate;
a first insulating layer disposed on the first interlayer insulating layer and including at least one of silicon nitride, silicon oxynitride, and silicon carbon nitride;
a second interlayer insulating layer disposed on the first insulating layer;
a contact structure passing through the second interlayer insulating layer and the first insulating layer, and contacting the lower wiring;
a second insulating layer disposed on the second interlayer insulating layer and including at least one of silicon nitride, silicon oxynitride, and silicon carbon nitride;
a third interlayer insulating layer disposed on the second insulating layer; and
an upper wiring disposed in the second insulating layer and the third interlayer insulating layer, and contacting the contact structure, wherein:

a top surface of the lower wiring is substantially coplanar with a top surface of the first interlayer insulating layer and contacts a bottom surface of the first insulating layer, a top surface of the contact structure is substantially coplanar with a top surface of the second interlayer insulating layer, the third interlayer insulating layer includes deuterium, the contact structure contacts the first insulating layer and is spaced apart from the second insulating layer, a top surface of the upper wiring is substantially coplanar with a top surface of the third interlayer insulating layer, a side surface of the upper wiring contacts the third interlayer insulating layer and the second insulating layer, and a width of the top surface of the upper wiring is greater than a width of a bottom surface of the upper wiring.

18. The semiconductor device of claim 17, wherein the lower wiring includes copper, the upper wiring includes aluminum, and the contact structure includes tungsten.

19. A semiconductor device, comprising:
a substrate;
a first interlayer insulating layer disposed on the substrate;
a lower wiring disposed in the first interlayer insulating layer and electrically connected to the substrate;
an insulating layer disposed on the first interlayer insulating layer and including at least one of silicon nitride, silicon oxynitride, and silicon carbon nitride;
a second interlayer insulating layer disposed on the insulating layer; and
an upper wiring disposed in the insulating layer and the second interlayer insulating layer, and contacting the lower wiring, the upper wiring including a first portion and a second portion that is disposed on the first portion, wherein:

a top surface of the lower wiring is substantially coplanar with a top surface of the first interlayer insulating layer and contacts a bottom surface of the insulating layer, the second interlayer insulating layer includes deuterium, a side surface of the first portion of the upper wiring contacts the insulating layer and the second interlayer insulating layer, a top surface of the second portion of the upper wiring is substantially coplanar with a top surface of the second interlayer insulating layer, a bottom surface of the second portion of the upper wiring contacts a top surface of the first portion of the upper wiring and the second interlayer insulating layer, a width of the bottom surface of second portion of the upper wiring is greater than a width of the top surface of first portion of the upper wiring.

20. The semiconductor device of claim 19, wherein the lower wiring includes copper, and the second portion of the upper wiring includes aluminum.

* * * * *